(12) United States Patent
Chen et al.

(10) Patent No.: US 10,345,794 B2
(45) Date of Patent: Jul. 9, 2019

(54) PRODUCT QUALITY PREDICTION METHOD FOR MASS CUSTOMIZATION

(71) Applicant: NATIONAL CHENG KUNG UNIVERSITY, Tainan (TW)

(72) Inventors: Chun-Fang Chen, Hsinchu County (TW); Hao Tieng, Tainan (TW); Fan-Tien Cheng, Tainan (TW); Haw-Ching Yang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 132 days.

(21) Appl. No.: 15/794,011

(22) Filed: Oct. 26, 2017

(65) Prior Publication Data

US 2018/0188717 A1 Jul. 5, 2018

(30) Foreign Application Priority Data

Dec. 30, 2016 (TW) .............................. 105144278 A

(51) Int. Cl.
*G05B 13/04* (2006.01)
*G05B 19/418* (2006.01)
(Continued)

(52) U.S. Cl.
CPC ... *G05B 19/41875* (2013.01); *G05B 19/0426* (2013.01); *G05B 19/41865* (2013.01);
(Continued)

(58) Field of Classification Search
CPC .......... G05B 19/41875; G05B 19/0426; G05B 19/41865; H01L 22/20
See application file for complete search history.

(56) References Cited

U.S. PATENT DOCUMENTS 5,477,446 A * 12/1995 Takakura ......... G05B 19/41875
700/86
7,593,912 B2 * 9/2009 Cheng .................. G05B 23/024
706/15
(Continued)

FOREIGN PATENT DOCUMENTS

CN 106021194 A 10/2016
TW 200532519 A 10/2005
(Continued)

OTHER PUBLICATIONS

Chih-Cheng Hsu, English Abstract of "Novel Metrology Data Quality Evaluation Scheme for the AVM System," http://ir.ib.ncku.edu.tw/handle/987654321/151065, Dissertations and Theses of Institute of Manufacturing Information and Systems, Nation Cheng Kung University, Dec. 30, 2014.

*Primary Examiner* — Vincent H Tran
(74) *Attorney, Agent, or Firm* — CKC & Partners Co., LLC

(57) ABSTRACT

A product quality prediction method for mass customization is provided. When a production system has a status change, data of sets of process parameters and actual measurement values of workpiece samples processed before the status change occurs, and data of sets of process parameters and actual measurement values of few workpiece samples processed after the status change occurs are used for build or retrain a prediction model, thereby predicting a metrology value of a next workpiece.

20 Claims, 7 Drawing Sheets

(51) Int. Cl.
 *H01L 21/66* (2006.01)
 *G05B 19/042* (2006.01)

(52) U.S. Cl.
 CPC .............. *H01L 22/20* (2013.01); *G05B 13/04* (2013.01); *G05B 2219/32075* (2013.01); *G05B 2219/35346* (2013.01); *Y02P 90/02* (2015.11); *Y02P 90/30* (2015.11)

(56) References Cited

U.S. PATENT DOCUMENTS

| | | | |
|---|---|---|---|
| 2009/0292386 A1* | 11/2009 | Cheng | G05B 19/41875 700/109 |
| 2010/0332013 A1* | 12/2010 | Choi | G05B 23/0254 700/110 |
| 2011/0238198 A1* | 9/2011 | Tsai | H01L 22/20 700/104 |
| 2011/0251707 A1* | 10/2011 | Cheng | G05B 19/41875 700/100 |
| 2011/0282480 A1* | 11/2011 | Jang | G05B 19/41875 700/110 |
| 2012/0029662 A1* | 2/2012 | Cheng | G05B 13/042 700/29 |
| 2014/0107828 A1* | 4/2014 | Zhu | G01R 31/2831 700/121 |
| 2014/0129503 A1* | 5/2014 | Yang | G06N 5/02 706/46 |
| 2014/0222376 A1* | 8/2014 | Kao | G05B 19/41875 702/182 |
| 2015/0105895 A1 | 4/2015 | Moyne et al. | |
| 2015/0162180 A1 | 6/2015 | Grau et al. | |
| 2015/0248127 A1* | 9/2015 | Yang | G05B 19/418 700/121 |
| 2015/0276558 A1* | 10/2015 | Cheng | G01N 1/00 702/179 |
| 2016/0041548 A1* | 2/2016 | Chung | G05B 23/0221 700/108 |
| 2018/0150038 A1* | 5/2018 | Lin | G05B 19/41875 |

FOREIGN PATENT DOCUMENTS

| | | |
|---|---|---|
| TW | I325109 B | 5/2010 |
| TW | 201346789 A | 11/2013 |
| TW | 201606469 A | 2/2016 |

* cited by examiner

PRODUCT QUALITY PREDICTION METHOD FOR MASS CUSTOMIZATION

RELATED APPLICATIONS

This application claims priority to Taiwan Application Serial Number 105144278, filed Dec. 30, 2016, which is herein incorporated by reference.

BACKGROUND

Field of Invention

The disclosure relates to a system and a product quality prediction method for mass customization (MC). More particularly, the disclosure relates to a product quality prediction method using a virtual metrology method with a target value adjustment (TVA) scheme.

Description of Related Art

One of the core values of Industry 4.0 targets to integrate people's demands into manufacturing for enhanced products, systems, and services for a wider variety of increasingly personalized customization of products. Thus, Industry 4.0 advances conventional manufacturing techniques from mass production toward mass customization. A mass customization manufacturing technique is required to have a rapid and quick response to a client's specification change. Take wheel machining automation (WMA) as an example. When machining conditions are changed to fabricate different types of wheels (for example, wheels with different central-hole diameters (CHD)), WMA cells with MC capability are requested to be designed to have a high degree of quick responsiveness to accurately change their process conditions and product accuracy measurements, so as to offer customized wheels at a large scale with low cost, short lead-time, and high quality. However, product accuracy measurements often take days and hours. If an abnormal product (workpiece) cannot be detected in time, the process stability, production and yield of a machine tool will be affected.

Virtual metrology (VM) uses process data of a process tool to predict quality of each product (workpiece) produced by the process tool when the product (a workpiece) has not yet been or cannot be actually measured by a metrology tool. The virtual metrology is applicable to various industries, such as semiconductor, thin film transistor-liquid crystal display (TFT-LCD) and tool machining industries, in which the product or workpiece is referred to as a wafer in IC foundries, a glass in TFT-LCD factories), and, for example, a wheel, a screw. When the virtual metrology is applied, a tremendous amount of historical data gas have to be collected or captured to build a prediction model for each production system or process tool. However, in general, mass customization is a small-volume large-variety production mode. Each product type often does not have a large amount of historical production and product metrology data, and the short lead-time requirement of mass customization does not allow a large volume of products to be first produced for generating a large amount of historical production and product metrology data thereafter. Hence, the mass customization production mode is disadvantageous to the implementation of virtual metrology.

SUMMARY

An object of the disclosure is to provide a product quality prediction method for mass customization, thereby providing a virtual metrology technique applicable to a mass customization production mode.

Another object of the disclosure is to provide a product quality prediction method for mass customization, thereby rapidly and accurately prediction product quality.

According to the aforementioned objects, an aspect of the disclosure is to provide a method for predicting quality of workpieces produced in mass customization. In the method, data of sets of first process parameters respectively corresponding to first workpieces in a one-to-one manner are obtained by a data collection device, in which the data of the sets of first process parameters are collected or used when a production system processes the first workpieces respectively. First actual measurement values respectively belonging to the first workpieces in a one-to-one manner are obtained by the data collection device, in which the first actual measurement values are generated by using a metrology tool to measure the first workpieces that have been processed by the production system. An average value of actual measurement values of all workpieces listed in a DS (determinative samples) set is calculated by a virtual metrology server, thereby obtaining a first average actual measurement value, in which the workpieces listed in the DS set are processed by the production system after the first workpieces have been processed, and the actual measurement values of the workpieces listed in the DS set are obtained by using the metrology tool to measure the workpieces that have been processed by the production system. The first actual measurement values are sorted by the virtual metrology server. An absolute value of a difference between every two adjacent first actual measurement values that have been sorted is calculated by the virtual metrology server. Breakpoints of the first workpieces are found by the virtual metrology server, in which each of the breakpoints is defined at the workpiece corresponding to one of the every two adjacent first actual measurement values of which the absolute value of the difference is greater than or equal to a breakpoint threshold value. The first workpieces are grouped into groups by the virtual metrology server in accordance with the breakpoints. An average value of actual measurement values of all workpieces in each of the groups is calculated by the virtual metrology server, thereby obtaining second average actual measurement values. The first actual measurement values of the first workpieces are respectively adjusted to target measurement value by the virtual metrology server, in which each of the target measurement values is the actual measurement value of its corresponding first workpiece minus the second average actual measurement value of its corresponding group and then plus the first average actual measurement value of the DS set. A prediction model is built or retrained by the virtual metrology server using the data of the sets of first process parameters and the target measurement values of the first workpieces in accordance with a prediction algorithm. A virtual metrology value of a next workpiece is predicted by the virtual metrology server inputting data of a set of process parameters belonging to the next workpiece into the prediction model, in which the production system uses the data of the set of process parameters to process the next workpiece after the first workpieces are processed.

Another aspect of the disclosure is to provide a method for predicting quality of workpieces produced in mass customization, the method including the steps of: obtaining data of a plurality of sets of first process parameters respectively corresponding to a plurality of first workpieces in a one-to-one manner, in which the data of the sets of first process parameters are collected or used when a production system processes the first workpieces respectively; obtaining a plurality of first actual measurement values respectively belonging to the first workpieces in a one-to-one manner, in which the first actual measurement values are generated by using a metrology tool to measure the first workpieces that have been processed by the production system; calculating an average value of actual measurement values of all workpieces listed in a DS (determinative samples) set, thereby obtaining a first average actual measurement value, in which the workpieces listed in the DS set are processed by the production system after the first workpieces have been processed, and the actual measurement values of the workpieces listed in the DS set are obtained by using the metrology tool to measure the workpieces that have been processed by the production system; sorting the first actual measurement values; calculating an absolute value of a difference between every two adjacent first actual measurement values that have been sorted; searching for a plurality of breakpoints of the first workpieces, in which each of the breakpoints is defined at the workpiece corresponding to one of the every two adjacent first actual measurement values of which the absolute value of the difference is greater than or equal to a breakpoint threshold value; grouping the first workpieces into plural groups in accordance with the breakpoints; calculating an average value of actual measurement values of all workpieces in each of the groups, thereby obtaining a plurality of second average actual measurement values; respectively adjusting the first actual measurement values of the first workpieces to a plurality of target measurement values, in which each of the target measurement values is the actual measurement value of its corresponding first workpiece minus the second average actual measurement value of its corresponding group and then plus the first average actual measurement value of the DS set; building or retraining a prediction model by using the data of the sets of first process parameters and the target measurement values of the first workpieces in accordance with a prediction algorithm; and predicting a virtual metrology value of a next workpiece by inputting data of a set of process parameters belonging to the next workpiece into the prediction model, in which the production system uses the data of the set of process parameters to process the next workpiece after the first workpieces are processed.

Thus, the applications of the embodiments of the disclosure provide a virtual metrology technique is applicable to a mass customization production mode, and product quality can be rapidly and accurately predicted.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 5B illustrates results of another application example adopting the product quality prediction method for mass customization in accordance with some embodiments of the disclosure, in which FIG. 5B is an enlarged view of detail AA in FIG. 5A.

DETAILED DESCRIPTION

Figure 1:
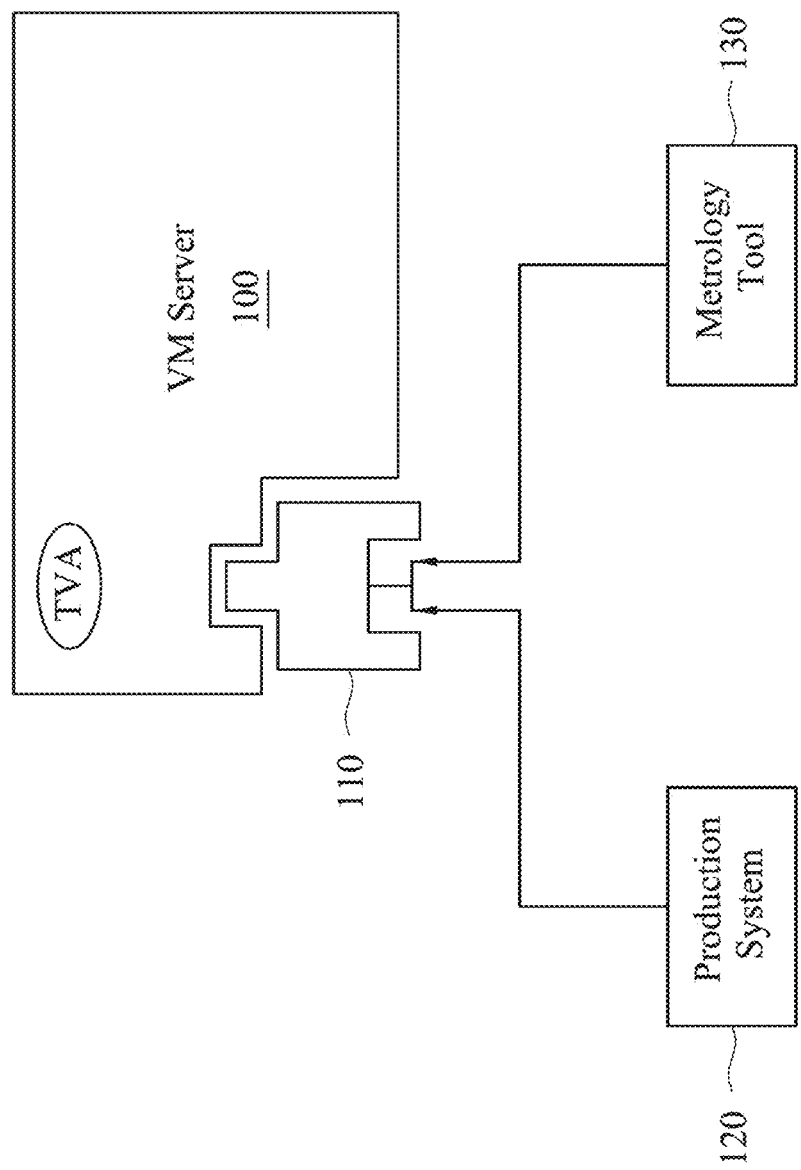
FIG. 1 is a schematic diagram showing a structure of a product quality prediction system for mass customization in accordance with some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, FIG. 1 is a schematic diagram showing a structure of a product quality prediction system for mass customization in accordance with some embodiments of the disclosure. The product quality prediction system for mass customization includes a virtual metrology (VM) server 100, a data collection device 110, a production system 120 and a metrology tool 130. The VM server 100 is used to build or retrain a prediction system to perform virtual metrology on a workpiece (product). The VM server 100 has a target value adjustment (TVA) scheme used for adjusting data of modeling samples (workpieces) in a mass customization environment to build or retrain the prediction system. The data collection device 110 is used to capture data of sets of process parameters used by the production system 120 to process the workpieces or collected when the production system 120 is processing the workpieces, and also to capture actual measurement values of the workpieces that are measured by the metrology tool 130. For example, the data collection device 110 may be a genetic embedded device (GED), and the VM server 100 may be an automatic virtual metrology (AVM) server. Embodiments of the disclosure also may be described in the context of a manufacturing system. Embodiments of the disclosure may be implemented in semiconductor fabrication or other manufacturing industries, in which the manufacturing system is configured to fabricate workpieces or products including, but not limited to, microprocessors, memory devices, digital signal processors, application specific integrated circuits (ASICs), or other similar devices; or vehicle wheels, screws or other similar elements. The production system 120 includes one or more processing tools that may be used to form one or more products, or portions thereof, in or on the workpieces (such as wafers). Persons of ordinary skill in the art should appreciate that the processing tools may be implemented in any number of entities of any type, including lithography tools, deposition tools, etching tools, polishing tools, annealing tools, machine tools, and the like. In some embodiments, the metrology tool 130 also includes one or more metrology tools, such as scatterometers, ellipsometers, scanning electron microscopes, and the like. For example, in WMA production, the production system 120 may include two lathes and one drilling machine. The metrology tool 130 may include a coordinate measuring machine (CMM) or an automated optical inspection (AOI) for sampling inspection of all precision items of the wheel. To handle the production of mass customization requirements, the WMA has to generate many types of adjustments for production conditions, thereby producing various types of wheels in the same production system 120.

Figure 2:
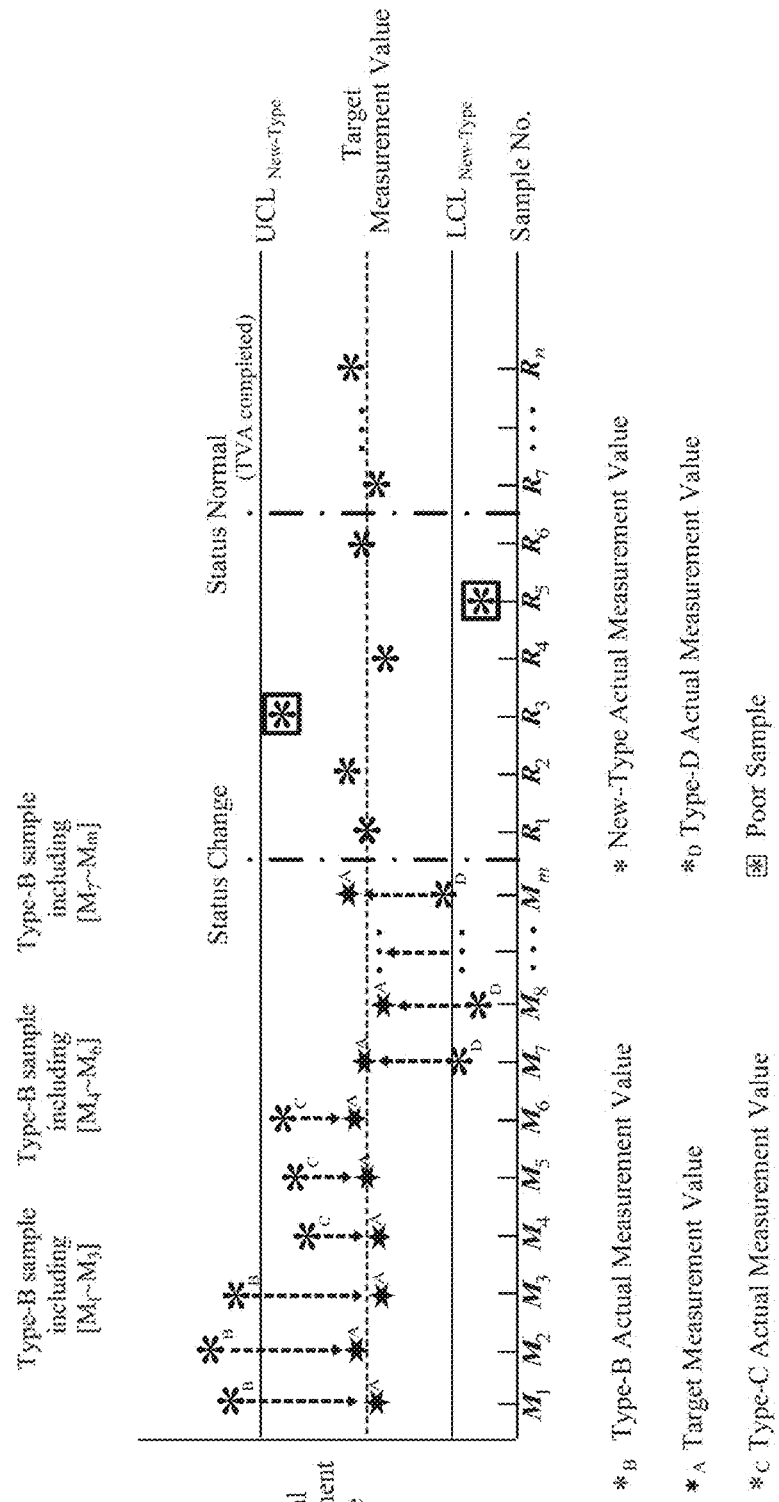
FIG. 2 illustrates actual measurement values of workpieces (samples) for explaining a product quality prediction method for mass customization in accordance with some embodiments of the disclosure.

Referring to FIG. 2, FIG. 2 illustrates actual measurement values of workpieces (samples) for explaining a product quality prediction method for mass customization in accordance with some embodiments of the disclosure. As shown in FIG. 2, the mass customization is featured in small-volume large-variety (type B, type C and type D), in which the number of each type of workpieces (samples) is quite limited, and thus it is very difficult to build a prediction (virtual metrology) model for each type of workpiece (product) because the number of each type of workpieces is not large enough (i.e. too few workpieces for each type). In particular, when the production system 120 has encountered a status change (for example, the type of workpiece being processed is changed from type B to type C), the prediction model needs to be built or retrained for performing virtual metrology. The status change (SC) of the production system may be resulted from tool maintenance, tool repair, recipe adjustment (for producing a new type of workpiece), or tool idle for a period of time. Thus, the problem faced by embodiments of the disclosure is, when the production system 120 has encountered a status change, how to build or retrain a prediction model by using data of sets of process parameters and actual measurement values belonging to the workpieces (samples) $M_1$ to $M_m$ that were produced by the production system 120 before the status change, as well as data of sets of process parameters and actual measurement values belonging to a limited (small) number of workpieces (samples) $R_1$, $R_2$, $R_4$ and/or $R_6$ that were produced by the production system 120 after the status change, thereby predicting a measurement value (virtual metrology value) of a new type of workpiece (such as $R_7$). Another problem faced by embodiments of the disclosure is, how to group the workpieces (samples) $M_1$ to $M_m$ in accordance with their different types. Thus, embodiments of the disclosure provide a target value adjustment (TVA) scheme to overcome the aforementioned problems.

Figure 3A:
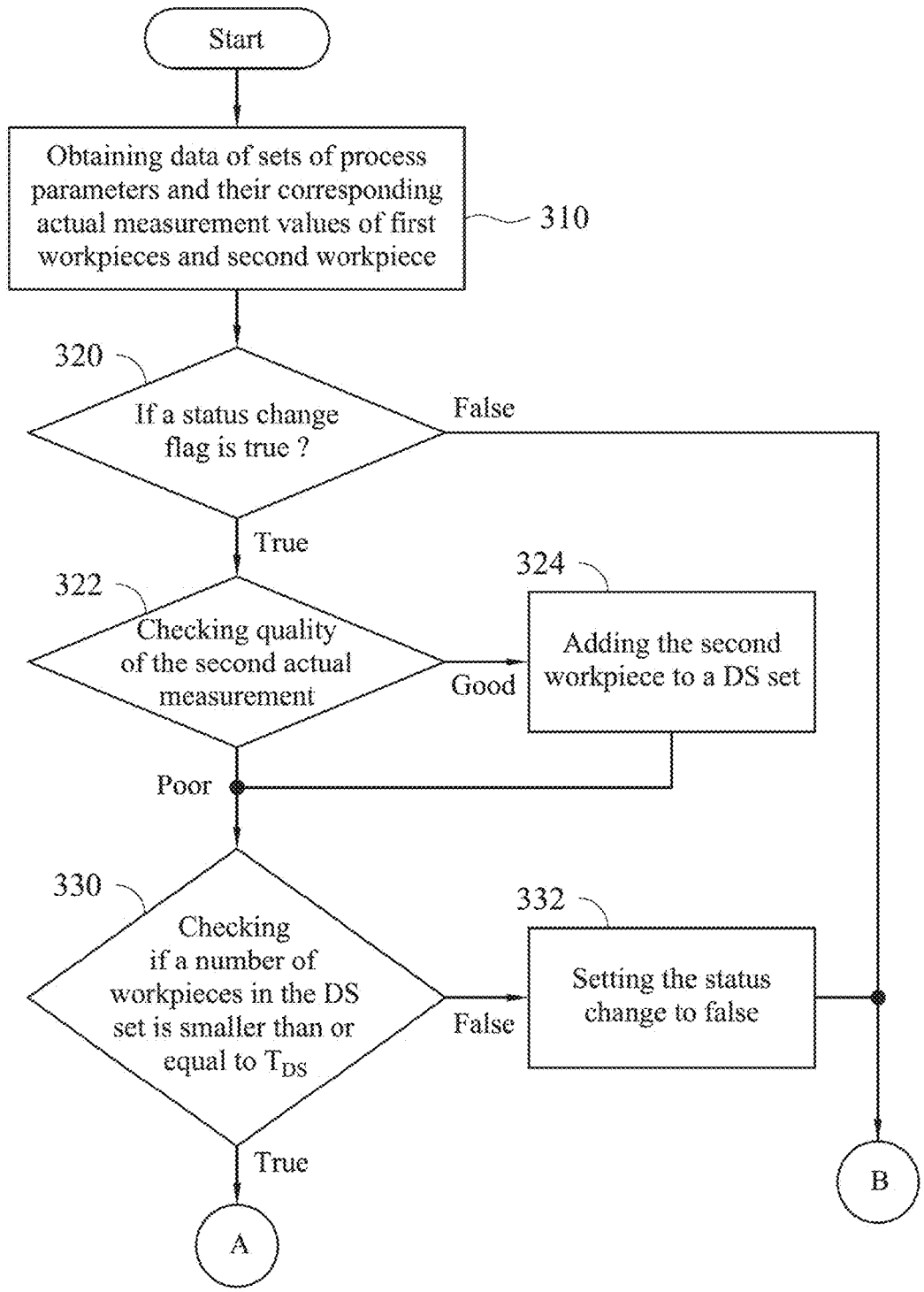
FIG. 3A and FIG. 3B illustrate a schematic flow chart showing the product quality prediction method for mass customization in accordance with some embodiments of the disclosure.
Figure 3B:
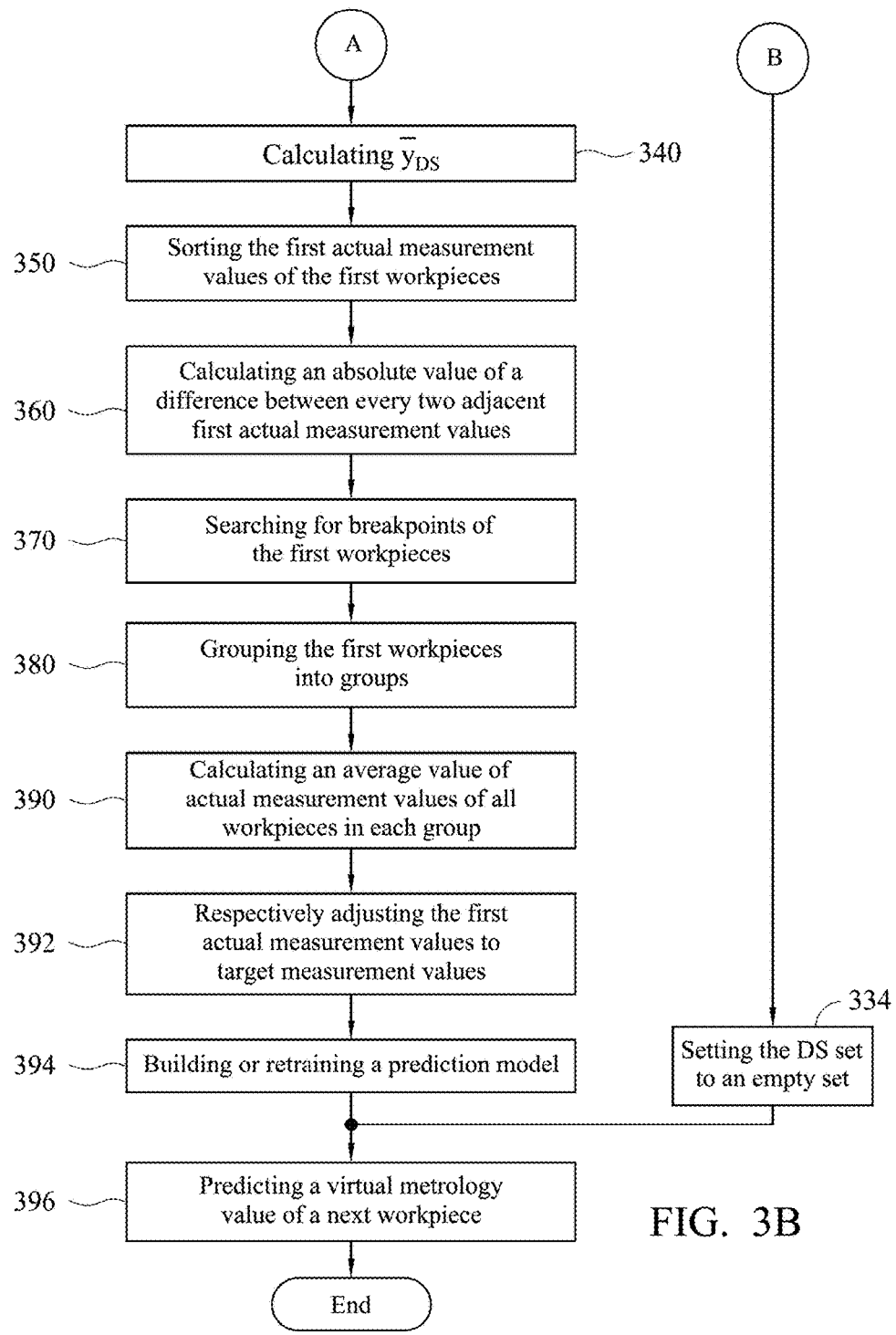

Referring to FIG. 2, FIG. 3A and FIG. 3B, FIG. 3A and FIG. 3B illustrate a schematic flow chart showing the product quality prediction method for mass customization in accordance with some embodiments of the disclosure. At first, operation 310 is performed to obtain (for example, by using the data collection device 110 shown in FIG. 1), data of sets of first process parameters and their corresponding actual measurement values (y) respectively corresponding to first workpieces ($M_1$ to $M_m$; sample number), in a one-to-one manner, and a set of second process parameters and a second actual measurement value (y) corresponding to a second workpiece ($R_1$, $R_2$, $R_4$ or $R_6$), in which the second workpiece is processed by a production system after the first workpieces have been processed by the production system, and the data of the sets of first process parameters are collected or used when the production system processes the first workpieces respectively, and the first actual measurement values are generated by using a metrology tool to measure the first workpieces that have been processed by the production system. The data of the set of second process parameters are collected or used when the production system processes the first workpieces respectively, and the second actual measurement value is generated by using the metrology tool to measure the second workpiece that has been processed by the production system.

In some embodiments, the data of the sets of first process parameters, the first actual measurement values, the data of the set of second process parameters, and the second actual measurement value are first stored in a database or a memory, and then are provided to a processor of the virtual metrology (VM) server for model building. The processor may include any type of processor, microprocessor, or processing logic that may interpret and execute instructions (e.g., a field programmable gate array (FPGA)). The processor may include a single device (e.g., a single core) and/or a group of devices (e.g., multi-core). The memory may include a random access memory (RAM) or another type of dynamic storage device that may store information and instructions for execution by the processor.

In some embodiments, the production system is used to process the first workpieces respectively, and the data of the sets of first process parameters are collected when the production system processes the first workpieces respectively. The metrology tool is used to measure the first workpieces that have been processed by the production system, thereby obtaining the first actual measurement values. After the first workpieces have been processed by the production system, the production system is used to process the second workpieces, and the data of the set of second process parameters are collected when the production system processes the second workpiece. The metrology tool is used to measure the second workpiece that has been processed by the production system, thereby obtaining the second actual measurement value.

Operations 320-394 may be performed by the VM server 100 shown in FIG. 1. Operation 320 is performed to check if a status change flag is true, in which when the production system has encountered a status change, the status change flag is set to true. In other words, if the status change flag is true, it represents that the status change of the production system occurs. In the embodiment shown in FIG. 2, when the production system is switched to product another type of workpiece, the status of the production system is changed and the status change flag is set to true. When the result of operation 320 is true, a metrology quality inspection operation 322 is performed to check if quality of the second actual measurement of the second workpiece (for example, $R_1$) is good, thereby obtaining a first checking result. When the first checking result is good, the second workpiece is added to a DS (determinative samples) set (operation 324). The workpieces ($R_1$, $R_2$, $R_4$ and/or $R_6$) are processed by the production system after the first workpieces ($M_1$ to $M_m$) are processed by the production system. When the first checking result is poor, the second workpiece is not added to a DS set. In some embodiments, the metrology quality inspection operation 322 is based on an upper control limit (UCL) and a lower control limit (LCL) that are set with a type of the second workpiece to check if the quality of the second actual measurement value is good.

In some embodiments, when an absolute value of a difference between the second actual measurement value of the second workpiece (for example, $R_3$, $R_5$) and an actual measurement value of a workpiece (for example, $R_2$, $R_4$) processed right before the second workpiece is greater than a metrology threshold ($\delta_T$) and quality of the actual measurement value of the workpiece (for example, $R_2$, $R_4$) right before the second workpiece is good, the first checking result is poor (false), meaning that the quality of the second actual measurement value of the second workpiece (for example, $R_3$, $R_5$) is poor. When the absolute value of the difference between the second actual measurement value of the second workpiece (for example, $R_2$, $R_4$, $R_6$) and the actual measurement value of the workpiece (for example, $R_1$, $R_2$, $R_4$) processed right before the second workpiece is smaller than or equal to the metrology threshold ($\delta_T$) and quality of the actual measurement value of the workpiece (for example, $R_1$, $R_2$, $R_4$) right before the second workpiece is good, the first checking result is good, meaning that the quality of the second actual measurement value of the second workpiece (for example, $R_2$, $R_4$, $R_6$) is good. The metrology threshold ($\delta_T$) is a predetermined value ($\alpha$) times an absolute value of an upper control limit (UCL) minus a lower control limit (LCL), in which both UCL and LCL are set with a (new) type of the second workpiece, and is defined as the following equation (1). In some embodiments, $\alpha$ is 0.2, and may be adjusted in accordance with actual conditions.

$$\delta_T = \alpha * |UCL_{New\ Type} - LCL_{New\ Type}| \qquad (1)$$

Thereafter, operation 330 is performed to check if a number of workpieces in the DS set (i.e. the size of the DS set, $Size_{DS}$) is smaller than or equal to a threshold ($T_{DS}$) of a number of workpieces in the DS set, thereby obtaining a second checking result. The $T_{DS}$ is defined as the number of new-type workpieces (the samples after the status change of the production system) needed for building or re-training a prediction model, and is utilized to determine the number of iterations of a TVA scheme that will be described later. In some embodiments, the threshold $T_{DS}$ of the number of workpieces in the DS set is merely needed to be 3, 4 or 5 and is sufficient to build or re-train the prediction model, thus meeting the requirement of mass customization that is a small-volume large-variety production mode. When the second checking result is false, it represents that the TVA scheme is completely performed and the production system is at a normal status, and thus the status change flag should be changed to false (operation 332) and the DS set is cleared and set to an empty set (operation 334). When the second checking result of operation 330 is true, operation 340 is performed to calculate an average value of actual measurement values of all workpieces listed in the DS set, thereby obtaining a first average actual measurement value ($\bar{y}_{DS}$) defined as the following equation (2). It is understood that, in some embodiments, the aforementioned operations 320, 322 and 330 may be skipped, and operation 340 is directly performed after operation 310.

$$\bar{y}_{DS} = \frac{\sum_{1}^{n} y_j}{n} \qquad (2)$$

Operation 350 is performed after operation 340 to sort the first actual measurement values of the first workpieces ($M_1$ to $M_m$). In some embodiments, the first actual measurement values of the first workpieces ($M_1$ to $M_m$) are sorted in an ascending order. Then, operation 360 is performed to calculate an absolute value of a difference between every two adjacent first actual measurement values that have been sorted. For example, |the actual measurement value $*_C$ of $M_4$—the actual measurement value $*_B$ of $M_3$|, |the actual measurement value $*_D$ of $M_7$—the actual measurement value $*_C$ of $M_6$|, in which the first workpiece $M_4$ is of type C, the first workpiece $M_3$ is of type B, the first workpiece $M_7$ is of type D, and the first workpiece $M_6$ is of type C. Thereafter, operation 370 is performed to search for breakpoints ([$M_3$, $M_6$] or [$M_4$, $M_7$]) of the first workpieces ($M_1$ to $M_m$), in which each of the breakpoints is defined at the workpiece corresponding to one of the every two adjacent first actual measurement values of which the absolute value of the difference is greater than or equal to a breakpoint threshold value. For example, the absolute value of the difference of two adjacent first actual measurement values (of the first workpieces $M_3$, $M_4$) is greater than the breakpoint threshold value, and a breakpoint $M_3$ is the former of the first workpieces $M_3$, $M_4$; and the absolute value of the difference of two adjacent first actual measurement values (of the first workpieces $M_6$, $M_7$) is greater than the breakpoint threshold value, and a breakpoint $M_6$ is the former of the first workpieces $M_6$, $M_7$. Certainly, each of the breakpoints may be defined at the workpiece corresponding to the latter of the every two adjacent first actual measurement values of which the absolute value of the difference is greater than or equal to the breakpoint threshold value, such as (the first workpieces $M_4$, $M_7$). It is noted that, in some embodiments, the breakpoint threshold value may be equal to the metrology threshold ($\delta_T$). The breakpoint threshold value also may be adjusted in accordance with actual conditions. Thereafter, operation 380 is performed to group the first workpieces ($M_1$ to $M_m$) into plural groups $G_1[M_1, M_2, M_3]$, $G_2[M_4, M_5, M_6]$, $G_3[M_7, \ldots, M_m]$ in accordance with the breakpoints.

Thereafter, operation 390 is performed to calculate an average value of actual measurement values $*_B$ of all workpieces in the group $G_1[M_1, M_2, M_3]$, an average value of actual measurement values $*_C$ of all workpieces in the group $G_2[M_4, M_5, M_6]$, and an average value of actual measurement values $*_D$ of all workpieces in the group $G_3[M_7, \ldots, M_m]$, thereby obtaining plural second average actual measurement values ($\bar{y}_{G_p}$). Then, operation 392 is performed to respectively adjust the first actual measurement values of the first workpieces to plural target measurement values ($y_{G_p}^A$), in which each of the target measurement values ($y_{G_p}^A$), is the actual measurement value of its corresponding first workpiece ($M_1, \ldots, M_m$) minus the second average actual measurement value ($\bar{y}_{G_p}$) of its corresponding group $G_p$ and then plus the first average actual measurement value ($\bar{y}_{DS}$) of the DS set, as shown in the following equation (3).

$$y_{G_p}^A = ((\text{actual measurement value of each workpiece in } G_p) - \bar{y}_{G_p}) + \bar{y}_{DS} \qquad (3)$$

A shown in FIG. 2, the actual measurement values $*_B$ of workpieces [$M_1$, $M_2$, $M_3$] in group $G_1$ are adjusted to respective target measurement values $*_A$; the actual measurement values $*_C$ of workpieces [$M_4$, $M_5$, $M_6$] in group $G_2$ are adjusted to respective target measurement values $*_A$; and the actual measurement values $*_C$ of workpieces [$M_7, \ldots, M_m$] in group $G_3$ are adjusted to respective target measurement values $*_A$. Thereafter, operation 394 is performed to build or retrain a prediction model by using the data of the sets of first process parameters and the target measurement values of the first workpieces in accordance with a prediction algorithm, and/or the data of the sets of process parameters and the actual measurement values of all of the workpieces in the DS set. The prediction algorithm includes a neural network (NN) algorithm, a multi-regression (MR) algorithm, a partial least square (PLS) algorithm, a support vector machines (SVM) algorithm or the like. After the prediction model is built or retrained, data of a set of process parameters belonging to a next workpiece is inputted into the prediction model to obtain (predict) a virtual metrology value of the next workpiece (operation 396), in which the production system uses the data of the set of process parameters to process the next workpiece after the first workpieces are processed.

It is understood that the method for identifying root causes of a yield loss is performed by the aforementioned steps. A computer program of the disclosure stored on a non-transitory tangible computer readable recording medium is used to perform the method described above. The aforementioned embodiments can be provided as a computer program product, which may include a machine-readable medium on which instructions are stored for programming a computer (or other electronic devices) to perform a process based on the embodiments of the disclosure. The machine-readable medium can be, but is not limited to, a floppy diskette, an optical disk, a compact disk-read-only memory (CD-ROM), a magneto-optical disk, a read-only memory (ROM), a random access memory (RAM), an erasable programmable read-only memory (EPROM), an electrically erasable programmable read-only memory (EEPROM), a magnetic or optical card, a flash memory, or another type of media/machine-readable medium suitable for storing electronic instructions. Moreover, the embodiments of the disclosure also can be downloaded as a computer program product, which may be transferred from a remote computer to a requesting computer by using data signals via a communication link (such as a network connection or the like).

Figure 4:
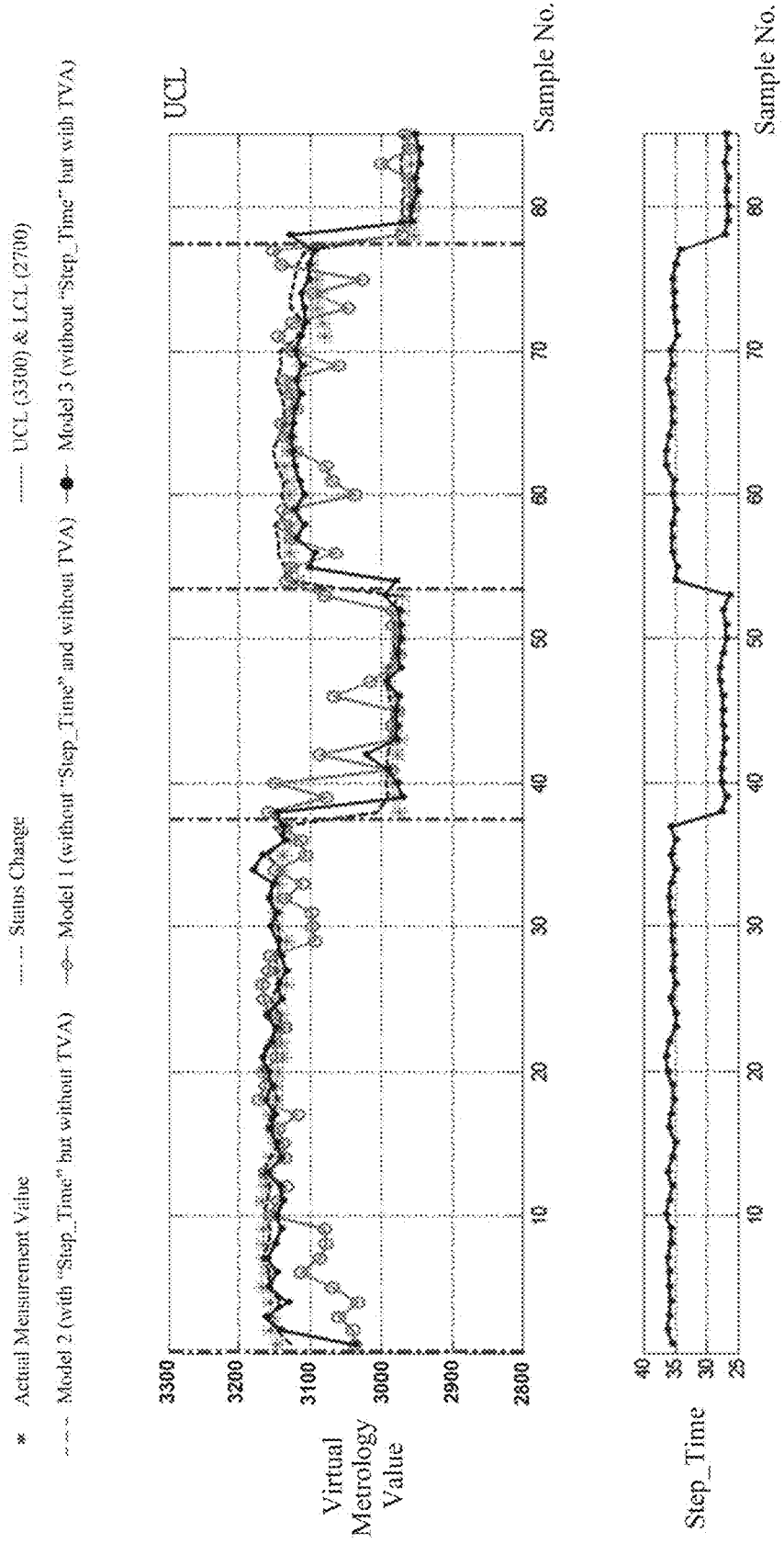
FIG. 4 illustrates results of an application example adopting the product quality prediction method for mass customization in accordance with some embodiments of the disclosure; and FIG. 5A

Hereinafter, two application examples are used to explain that embodiments of the disclosure have significant efficacy. Referring to FIG. 4, FIG. 4 illustrates results of an application example adopting the product quality prediction method for mass customization in accordance with some embodiments of the disclosure. This application example is used to predict an etching depth (virtual metrology value) of a material layer etched by a semiconductor dry-etching process chamber. Different material layers on wafers are often etched in the same semiconductor dry-etching process chamber, just like the aforementioned workpieces of different types. Because the number of wafers to be processed for each material layer is limited, this application example is in the aforementioned small-volume large-variety production mode. FIG. 4 shows results of three VM models which are (1) a VM model (referred to as "model 1") without a key parameter "Step_Time" and without the TVA scheme; (2) a VM model (referred to as "model 2") with the key parameter "Step_Time" but without the TVA scheme; and (3) a VM model (referred to as "model 3") without the key parameter "Step_Time" but with the TVA scheme, in which the VM models are built by a neural network (NN) algorithm. In this application example, data of sets of process parameters and actual measurement values belonging to the first 117 workpieces (samples) are used to establish the above three VM models, and then data of sets of process parameters and actual measurement values belonging to 85 workpieces (samples) shown in FIG. 4 are adopted to evaluate the conjecture accuracies of the three VM models. The process parameters used in the application example may include 25 process parameters (such as APC Valve Angle, RF Power, Gas Flow, etc.). According to expert knowledge, the process time of the dry-etching (i.e. "Step_Time") is the key feature related to the layer/recipe changes as it directly affects the final etching depth. This application sample uses a mean absolute percentage error (MAPE) to evaluate accuracies of the VM models, as shown in the following equation (4).

$$MAPE = \frac{\sum_{i=1}^{n}|(\hat{y}_i - y_i)/t|}{n} \times 100\% \quad (4)$$

where $\hat{y}_i$ represents a VM value; $y_i$ represents an actual measurement value; t represents a target value; and n represents the number of samples (sample size).

As shown in FIG. 4, the MAPE of model 1 is 1.79%, and it needed more workpieces (samples) for retuning when the production system has encountered a status change. Thus, the accuracy of model 1 is too low. The MAPE of model 2 is 0.62%, and is able to respond to the variance caused by the status change encountered by the production system. However, when the key parameter cannot be confirmed or is not available, the TVA scheme of the disclosure is needed. The accuracy of model 3 (without the key parameter "Step_Time" but with the TVA scheme) is 0.92%, and is able to respond to the variance caused by the status change encountered by the production system. Certainly, if model 3 had the key parameter "Step_Time" and the TVA scheme, its MAPE would be much smaller, and its accuracy would be much higher.

Figure 5A:
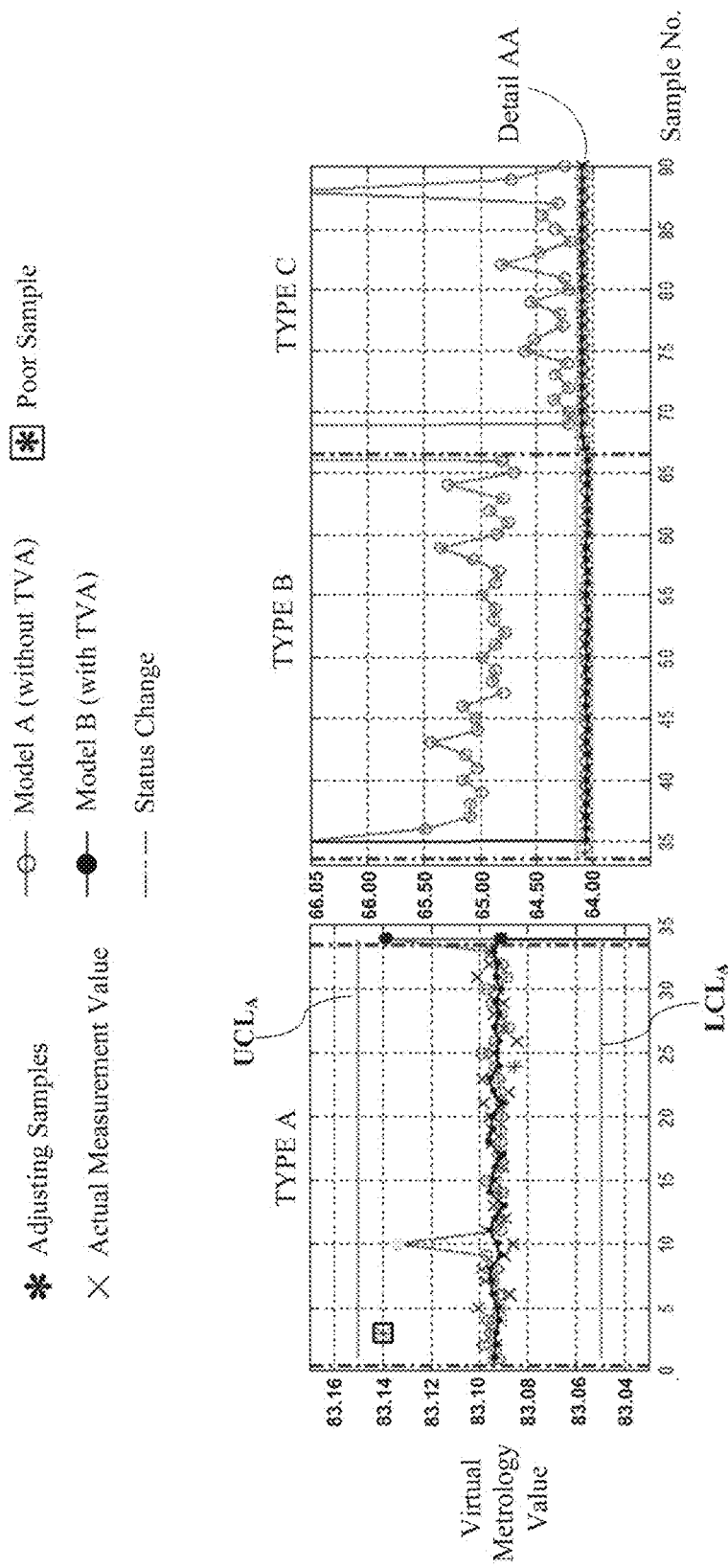
Figure 5B:
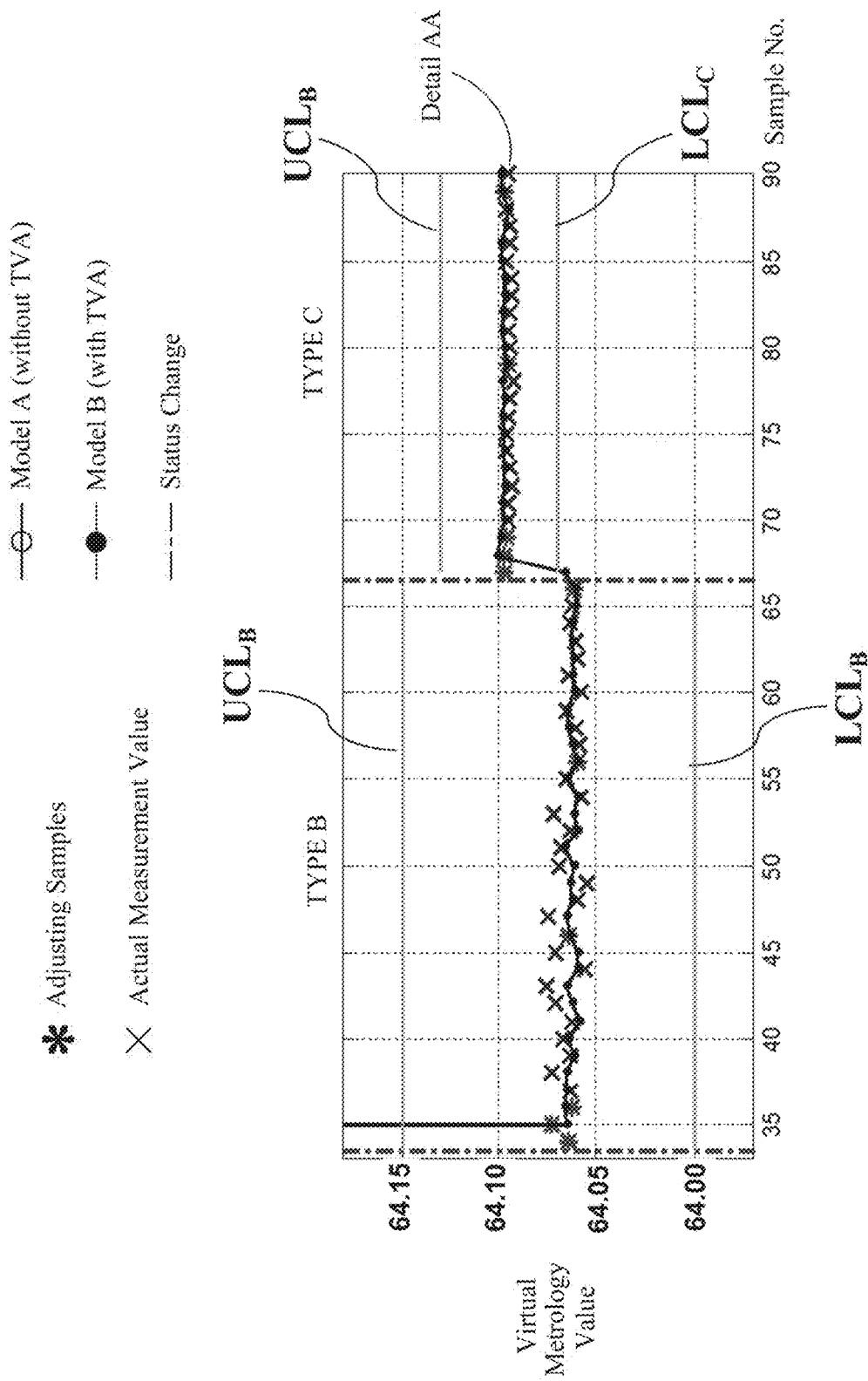

Referring to FIG. 5A and FIG. 5B, FIG. 5A and FIG. 5B illustrates results of another application example adopting the product quality prediction method for mass customization in accordance with some embodiments of the disclosure, in which FIG. 5B is an enlarged view of detail AA in FIG. 5A. This application example is used to predict central-hole diameters (virtual metrology values) of three types of aluminum casting alloy wheels produced by a WMA cell, and an AOI is adopted in this application example to provide actual measurement values (real metrology) for accuracy check. The three types of aluminum casting alloy wheels are a type-A wheel (central-hole diameter (CHD)=83.10 mm), a type-B wheel (CHD=64.05 mm), and a type-C wheel (CHD=64.10 mm). Totally data of 115 wheels (data of 115 sets of process parameters and 115 actual measurement values) are used in this application example, in which there are 58 sets of data of type-A wheel (samples), 33 sets of data of type-B wheels (samples) and 24 sets of data of type-C wheels (samples). The first 25 sets of data of type-A wheels (samples) are used to build two VM models that are a VM model without the TVA schemed (referred to as "Model A") and a VM model with the TVA scheme (referred to as "Model B"). The first 25 type-A wheel are produced several days ago, and then 33 type-A wheels, 33 type-B wheels and 24 type-C wheels are produced in sequence. FIG. 5A and FIG. 5B illustrate the results of using Model A and Model B to predict the virtual metrology (VM) values of the 33 type-A wheels, the 33 type-B wheels and the 24 type-C wheels. According to the scenario mentioned above, three SCs (Status Changes) occur before Samples (wheels) 1, 34, and 67 as shown in FIG. 5A. All the SCs are caused by AOI calibrations required for measuring the CHDs of the type-B wheels and the type-C wheels. The number of workpieces in the DS set for building or retraining Model B is 3, $Size_{DS}$=3, i.e. threshold ($T_{DS}$) of a number of workpieces in the DS set. This application uses a mean absolute error (MAE) to evaluate accuracies of the VM models, as shown in the following equation (5).

$$MAE = \frac{\sum_{i=1}^{n}|(\hat{y}_i - y_i)|}{n} \quad (5)$$

where $\hat{y}_i$ represents a VM value; $y_i$ represents an actual measurement value; and n represents the number of samples (sample size).

As shown in FIG. 5A and FIG. 5B, the MAE of VM values of the type-A wheels predicated by Model A is 0.0057 mm that is acceptable due to the fact that the original VM model is built by adopting data of the type-A wheels.

However, after the wheel production is changed from the type A (CHD=83.10 mm) to the type B (CHD=64.05 mm), the results of VM values of the type-B wheels predicted by Model A go wild, and are undesirable. Then, when the wheel production is changed to the type C (CHD=64.10 mm) from the type B, although the CHD change is quite small, the results of VM values of the type-C wheels predicted by Model A are still unacceptable.

In contrast, as the prediction results of Model B (with the TVA scheme) shown in FIG. 5A and FIG. 5B, after encountering an SC before Sample 1, two samples with good metrology quality are added into the DS set. The TVA scheme finds that the AOI metrology quality of Sample 3 is poor and cannot be added to the DS set, and Sample 4 is included into the DS set instead. Then, only one out of ten samples is adopted to refresh the VM models. The MAE of VM values of the type-A wheels predicated by Model B (with the TVA scheme) is 0.0034 mm, and is better than that predicted by Model A (without the TVA scheme). Thereafter, the wheel production is changed to type B, and thus another SC is encountered before Sample 34. Again, three samples with good metrology quality are added to the DS set, and one out of ten samples is adopted to refresh the VM models. As far as the VM accuracy is concerned, only the accuracy of the VM value of Sample 34 (which is the first sample after the SC) is not good due to the first wheel changed from type A to type B. The VM results of all the other samples of type B are quite close to the AOI metrology values (actual measurement values) with MAE value being 0.0040 mm. Thereafter, the wheel production is changed to type C, and thus another SC is encountered before Sample 67. The VM performance of type-C wheels by Model B (with the TVA scheme) is as good as that of type-B wheels.

It can be known from the aforementioned embodiments that, the product quality prediction method for mass customization provides a virtual metrology technique applicable to a mass customization production mode to predict product quality rapidly and accurately.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims.

What is claimed is:

1. A method for predicting quality of workpieces produced in mass customization, the method comprising:
    obtaining, by a data collection device, data of a plurality of sets of first process parameters respectively corresponding to a plurality of first workpieces in a one-to-one manner, wherein the data of the sets of first process parameters are collected or used when a production system processes the first workpieces respectively;
    obtaining, by the data collection device, a plurality of first actual measurement values respectively belonging to the first workpieces in a one-to-one manner, wherein the first actual measurement values are generated by using a metrology tool to measure the first workpieces that have been processed by the production system;
    calculating, by a virtual metrology server, an average value of actual measurement values of all workpieces listed in a DS (determinative samples) set, thereby obtaining a first average actual measurement value, wherein the workpieces listed in the DS set are processed by the production system after the first workpieces have been processed, and the actual measurement values of the workpieces listed in the DS set are obtained by using the metrology tool to measure the workpieces that have been processed by the production system;
    sorting, by the virtual metrology server, the first actual measurement values;
    calculating, by the virtual metrology server, an absolute value of a difference between every two adjacent first actual measurement values that have been sorted;
    searching for, by the virtual metrology server, a plurality of breakpoints of the first workpieces, wherein each of the breakpoints is defined at the workpiece corresponding to one of the every two adjacent first actual measurement values of which the absolute value of the difference is greater than or equal to a breakpoint threshold value;
    grouping, by the virtual metrology server, the first workpieces into a plurality of groups in accordance with the breakpoints;
    calculating, by the virtual metrology server, an average value of actual measurement values of all workpieces in each of the groups, thereby obtaining a plurality of second average actual measurement values;
    respectively adjusting, by the virtual metrology server, the first actual measurement values of the first workpieces to a plurality of target measurement values, wherein each of the target measurement values is the actual measurement value of its corresponding first workpiece minus the second average actual measurement value of its corresponding group and then plus the first average actual measurement value of the DS set;
    building or retraining, by the virtual metrology server, a prediction model by using the data of the sets of first process parameters and the target measurement values of the first workpieces in accordance with a prediction algorithm; and
    predicting, by the virtual metrology server, a virtual metrology value of a next workpiece by inputting data of a set of process parameters belonging to the next workpiece into the prediction model, wherein the production system uses the data of the set of process parameters to process the next workpiece after the first workpieces are processed.

2. The method of claim 1, further comprising:
    obtaining, by the data collection device, data of a set of second process parameters corresponding to a second workpiece, wherein the set of second process parameters is collected or used when the production system processes the second workpiece;
    obtaining, by the data collection device, a second actual measurement value corresponding to the second workpiece, wherein the second actual measurement value is generated by using the metrology tool to measure the second workpiece that has been processed by the production system;
    setting, by the virtual metrology server, a status change flag to true when a status change of the production system occurs;
    when the status change flag is true, performing, by the virtual metrology server, a metrology quality inspection operation to check if quality of the second actual measurement is good, thereby obtaining a first checking result;
    when the first checking result is good, adding, by the virtual metrology server, the second workpiece to the DS set;

checking, by the virtual metrology server, if a number of workpieces in the DS set is smaller than or equal to a threshold of a number of workpieces in the DS set, thereby obtaining a second checking result; and when the second checking result is true, calculating, by the virtual metrology server, the average value of actual measurement values of all workpieces in a DS set, thereby obtaining the first average actual measurement value.

3. The method of claim 2, further comprising:
when the status change flag is false, resetting, by the virtual metrology server, the DS set to an empty set.

4. The method of claim 2, wherein the metrology quality inspection operation is based on an upper control limit (UCL) and a lower control limit (LCL) that are set with a type of the second workpiece to check if the quality of the second actual measurement value is good.

5. The method of claim 2, wherein in the metrology quality inspection operation, when an absolute value of a difference between the second actual measurement value and an actual measurement value of a workpiece processed right before the second workpiece is greater than a metrology threshold and quality of the actual measurement value of the workpiece right before the second workpiece is good, the first checking result is poor, meaning that the quality of the second actual measurement value is poor; and when the absolute value of the difference between the second actual measurement value and the actual measurement value of the workpiece processed right before the second workpiece is smaller than or equal to the metrology threshold, the first checking result is good, meaning that the quality of the second actual measurement value is good.

6. The method of claim 2, wherein the threshold of the number of workpieces in the DS set is 3, 4 or 5.

7. The method of claim 2, further comprising:
using the production system to process the first workpieces respectively, and collecting the data of the sets of first process parameters when the production system processes the first workpieces respectively;
using the metrology tool to measure the first workpieces that have been processed by the production system, thereby obtaining the first actual measurement values;
using the production system to process the second workpieces after the first workpieces have been processed by the production system, and collecting the data of the set of second process parameters when the production system processes the second workpiece;
using the metrology tool to measure the second workpiece that has been processed by the production system, thereby obtaining the second actual measurement value.

8. The method of claim 2, wherein the status change of the production system is resulted from tool maintenance, tool repair, recipe adjustment, or tool idle for a period of time.

9. The method of claim 2, further comprising:
setting the status flag to false and resetting the DS set to an empty set by the virtual metrology server, when the second checking result is false.

10. The method of claim 2, wherein an operation of building or retraining the prediction model is performed by using the data of the sets of first process parameters and the target measurement values of the first workpieces as well as the data of the sets of process parameters and the actual measurement values of all of the workpieces in the DS set.

11. A method for predicting quality of workpieces produced in mass customization, the method comprising:

obtaining data of a plurality of sets of first process parameters respectively corresponding to a plurality of first workpieces in a one-to-one manner, wherein the data of the sets of first process parameters are collected or used when a production system processes the first workpieces respectively;

obtaining a plurality of first actual measurement values respectively belonging to the first workpieces in a one-to-one manner, wherein the first actual measurement values are generated by using a metrology tool to measure the first workpieces that have been processed by the production system;

calculating an average value of actual measurement values of all workpieces listed in a DS (determinative samples) set, thereby obtaining a first average actual measurement value, wherein the workpieces listed in the DS set are processed by the production system after the first workpieces have been processed, and the actual measurement values of the workpieces listed in the DS set are obtained by using the metrology tool to measure the workpieces that have been processed by the production system;

sorting the first actual measurement values;

calculating an absolute value of a difference between every two adjacent first actual measurement values that have been sorted;

searching for a plurality of breakpoints of the first workpieces, wherein each of the breakpoints is defined at the workpiece corresponding to one of the every two adjacent first actual measurement values of which the absolute value of the difference is greater than or equal to a breakpoint threshold value;

grouping the first workpieces into a plurality of groups in accordance with the breakpoints;

calculating an average value of actual measurement values of all workpieces in each of the groups, thereby obtaining a plurality of second average actual measurement values;

respectively adjusting the first actual measurement values of the first workpieces to a plurality of target measurement values, wherein each of the target measurement values is the actual measurement value of its corresponding first workpiece minus the second average actual measurement value of its corresponding group and then plus the first average actual measurement value of the DS set;

building or retraining a prediction model by using the data of the sets of first process parameters and the target measurement values of the first workpieces in accordance with a prediction algorithm; and predicting a virtual metrology value of a next workpiece by inputting data of a set of process parameters belonging to the next workpiece into the prediction model, wherein the production system uses the data of the set of process parameters to process the next workpiece after the first workpieces are processed.

12. The method of claim 11, further comprising:
obtaining data of a set of second process parameters corresponding to a second workpiece, wherein the set of second process parameters is collected or used when the production system processes the second workpiece;
obtaining a second actual measurement value corresponding to the second workpiece, wherein the second actual measurement value is generated by using the metrology tool to measure the second workpiece that has been processed by the production system;

setting a status change flag to true when a status change of the production system occurs;

when the status change flag is true, performing a metrology quality inspection operation to check if quality of the second actual measurement is good, thereby obtaining a first checking result;

when the first checking result is good, adding the second workpiece to the DS set;

checking if a number of workpieces in the DS set is smaller than or equal to a threshold of a number of workpieces in the DS set, thereby obtaining a second checking result; and when the second checking result is true, calculating the average value of actual measurement values of all workpieces in a DS set, thereby obtaining the first average actual measurement value.

13. The method of claim 12, further comprising:
when the status change flag is false, resetting the DS set to an empty set.

14. The method of claim 12, wherein the metrology quality inspection operation is based on an upper control limit (UCL) and a lower control limit (LCL) that are set with a type of the second workpiece to check if the quality of the second actual measurement value is good.

15. The method of claim 12, wherein in the metrology quality inspection operation, when an absolute value of a difference between the second actual measurement value and an actual measurement value of a workpiece processed right before the second workpiece is greater than a metrology threshold and quality of the actual measurement value of the workpiece right before the second workpiece is good, the first checking result is poor, meaning that the quality of the second actual measurement value is poor; and when the absolute value of the difference between the second actual measurement value and the actual measurement value of the workpiece processed right before the second workpiece is smaller than or equal to the metrology threshold, the first checking result is good, meaning that the quality of the second actual measurement value is good.

16. The method of claim 12, wherein the threshold of the number of workpieces in the DS set is 3, 4 or 5.

17. The method of claim 12, further comprising:
using the production system to process the first workpieces respectively, and collecting the data of the sets of first process parameters when the production system processes the first workpieces respectively;

using the metrology tool to measure the first workpieces that have been processed by the production system, thereby obtaining the first actual measurement values;

using the production system to process the second workpieces after the first workpieces have been processed by the production system, and collecting the data of the set of second process parameters when the production system processes the second workpiece;

using the metrology tool to measure the second workpiece that has been processed by the production system, thereby obtaining the second actual measurement value.

18. The method of claim 12, wherein the status change of the production system is resulted from tool maintenance, tool repair, recipe adjustment, or tool idle for a period of time.

19. The method of claim 12, further comprising:
setting the status flag to false and resetting the DS set to an empty set by the virtual metrology server, when the second checking result is false.

20. The method of claim 12, wherein an operation of building or retraining the prediction model is performed by using the data of the sets of first process parameters and the target measurement values of the first workpieces as well as the data of the sets of process parameters and the actual measurement values of all of the workpieces in the DS set.

* * * * *